United States Patent [19]

Mille et al.

[11] Patent Number: 5,053,743
[45] Date of Patent: Oct. 1, 1991

[54] HIGH VOLTAGE SPIRAL RESISTOR

[75] Inventors: Jacques Mille, Aix En Provence; Daniel Quessada, Pourrieres, both of France

[73] Assignee: SGS-Thomson Microelectronics S.A., Gentilly, France

[21] Appl. No.: 508,614

[22] Filed: Apr. 13, 1990

[30] Foreign Application Priority Data

Apr. 14, 1989 [FR] France .................. 89 05280

[51] Int. Cl.⁵ .............................. H01C 3/14
[52] U.S. Cl. .................. 338/297; 338/285; 338/306; 338/307; 357/51
[58] Field of Search .............. 338/297, 306, 307, 308, 338/285; 357/51, 52, 53, 20; 437/918

[56] References Cited

U.S. PATENT DOCUMENTS

| | | | |
|---|---|---|---|
| 2,775,673 | 12/1956 | Johnson | 338/297 |
| 3,955,169 | 5/1976 | Kerfoot et al. | 338/297 X |
| 4,139,833 | 2/1979 | Kirsch | 338/308 |
| 4,792,840 | 4/1987 | Nadd | 357/51 |
| 4,803,538 | 2/1989 | Voss | 357/51 X |
| 4,860,083 | 8/1989 | Kojo | 357/51 |

OTHER PUBLICATIONS

"Doppeldiffundierter planarer Halbleiterwiderstand, insbesondere Emitterwiderstand in Hf-Lesitungstransistoren," (no author given), *Neues aus der Technik*, Nr. 1, Feb. 1, 1973, p. 2.

*Primary Examiner*—Marvin M. Lateef
*Attorney, Agent, or Firm*—Lowe, Price, Leblanc and Becker

[57] ABSTRACT

A resistor constituted by a spiral region (4) of a second conductivity type and having a determined doping level, formed on a first surface of a semiconductor substrate (1) of the first conductivity type, having a first terminal on the first surface of the substrate and a second terminal electrically connected to the opposite surface of the substrate through an overdoped region of the same conductivity type as the substrate, more conductive areas (11) being formed at determined places of the spiral.

5 Claims, 1 Drawing Sheet

HIGH VOLTAGE SPIRAL RESISTOR

BACKGROUND OF THE INVENTION

The present invention relates to a high voltage spiral-shaped diffused resistor integrated in a semiconductor substrate and liable to have one of its extremities connected to a point of the substrate submitted to high voltage and the other extremity submitted to low voltage.

Such a resistor is described in U.S. Pat. No. 4,792,840. This resistor is constituted by a spiral-shaped region of a second conductivity type and having a given doping level, formed on a first surface of a semiconductor substrate of the first conductivity type and comprises a first terminal associated with a first extremity of the spiral and a second terminal on a second surface of the substrate, the second extremity of the spiral being connected to an overdoped region of the same conductivity type as the substrate.

It will be clear to those skilled in the art that such a resistor can be formed by connecting an extremity of the spiral with the rear surface of the substrate either, as this is more particularly described in the above U.S. patent, at the center of the spiral or at the external spiral extremity. The second method will be preferably chosen in case the spiral surrounds the semiconductpr chip on which it is arranged, so that the spiral further serves as peripheral guard rings.

However, the realization of a spiral resistor such as described in the above U.S. patent causes implementation difficulties especially as regards breakdown voltage and adjustment of the resistor value.

Indeed, the number of spiral turns and the distance between each turn have to be selected as a function of electrostatic requirements on the basis of the maximum difference value of the voltage liable to be applied between the front and rear surfaces of the substrate, while taking into account the doping values of the substrate and spiral. However, when considering a spiral such as illustrated in FIG. 2 of the abovementioned U.S. patent, and comprising a sprial winding around a central point, it can be seen that the last turn of the spiral has a length much larger than that of the preceding turns, especially of the inner turn. Thus, the voltage drop on the last turn will be much higher than the voltage on each of the other turns. As a result, it is not possible for tightly rolled up spirals to exceed a given breakdown voltage for determined values of the various doping levels.

Moreover, in the above U.S. patent, the spiral resistor is formed as part of an integrated circuit comprising other components and more particularly power bipolar or MOS transistors. If it is desired to form a low cost spiral, it has to be formed during the same manufacturing steps as circuits arranged on the same integrated circuit wafer, that is, its doping level will be chosen among the doping levels already provided for the manufacturing of the integrated circuit referred to. For example, in some integrated circuits there are only two steps for doping a substrate according to the conductivity type opposite to that of the substrate, a so-called low doping level and a so-called high doping level. It has been indicated in the above that the number of turns to be provided for the spiral depends upon electrostatic parameters associated with the voltage it has to withstand; therefore, for obtaining a predetermined resistance, it should be possible to modify its resistivity by unit length, that is, on its section or on its doping level. It is not economical to act on the doping level or on the depth of the diffused layer used by the spiral because this would require an additional manufacturing step, and also, it is not convenient to act on the spiral width because this would entail excessive bulkiness thereof.

Thus, an object of the invention is to improve the realization of spiral resistors of the above type to avoid the two above mentioned drawbacks, that is, to permit, on the one hand, to increase the maximum breakdown voltage of a spiral resistor and, on the other hand, to form spiral resistors having predetermined values, without increasing the number of manufacturing steps for the integrated circuit.

SUMMARY OF THE INVENTION

To achieve this object, the invention provides to form a spiral resistor constituted by a region having a first doping level and to render selected localized portions of this resistor more conductive, for example by overdoping with the same conductivity type as that of the spiral, while highly doped regions of this conductivity type are formed in the integrated circuit chip.

BRIEF DISCLOSURE OF THE DRAWINGS

The foregoing and other objects, features and advantages of the invention will be apparent from the following detailed description of preferred embodiments as illustrated in the accompanying drawings wherein.

DESCRIPTION OF A PREFERRED EMBODIMENT

Figure 1:
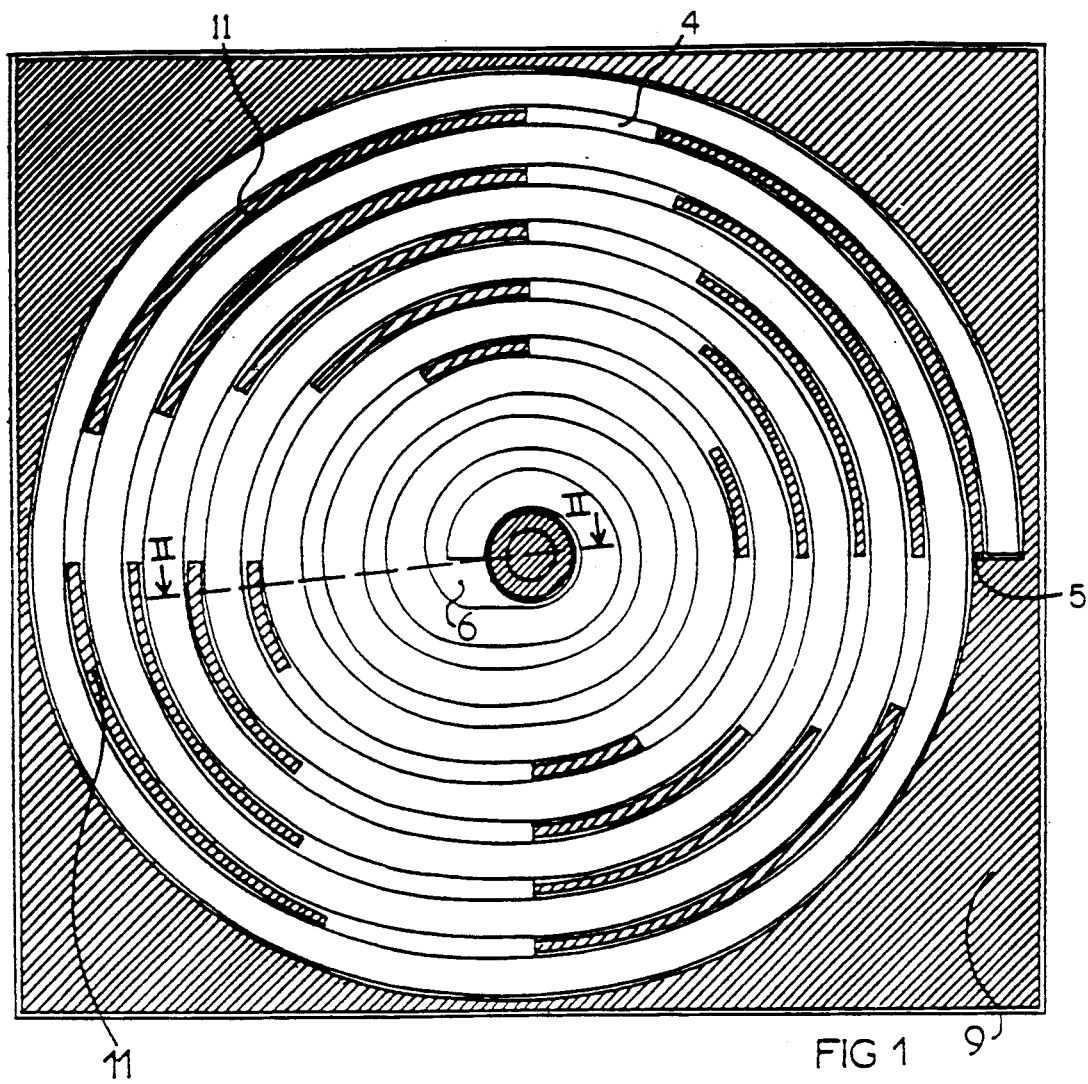
FIG. 1 is a top view of an exemplary spiral according to the invention.
Figure 2:
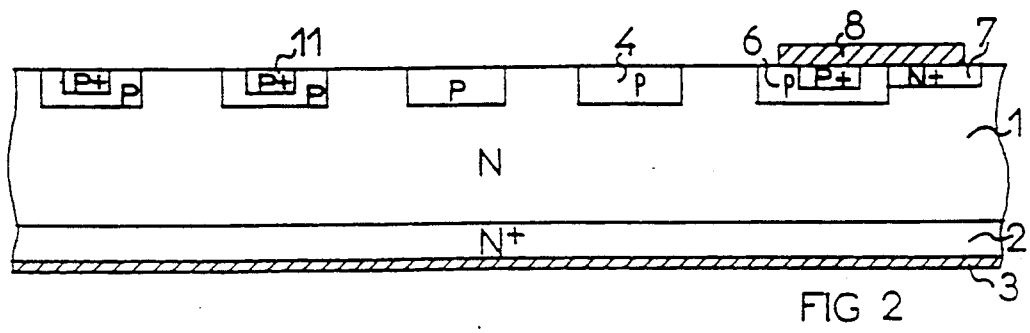
FIG. 2 is a partial section view according to line II—II of FIG. 1.

As shown in FIG. 1 and in the partial section view of FIG. 2 corresponding to line II—II of FIG. 1, the invention provides for a spiral resistor formed in a substrate 1 of a first conductivity type, for example N, the rear surface of which comprises an N-type overdoped layer 2 and is coated with a metallization 3. The spiral resistor is constituted by an opposite type diffused region 4 (here P) wound in the form of a spiral comprising a first extremity region 5 and a second extremity region 6. A portion of one of the extremity regions, here the internal extremity region 6 is overdoped and connected to an N-type overdoped region 7 of the substrate through a metallization 8. Thus, the spiral extremity is conductively connected with rear surface metallization 3. The extremity region 5 is in turn connected to a terminal (not shown) on the front surface of the substrate, either directly or through a P+ peripheral region 9.

The above corresponds to the state of the art as disclosed in U.S. Pat. No. 4,792,840.

The improvement according to the invention consists in modulating the spiral resistivity. In the embodiment illustrated in FIGS. 1 and 2, P+-type areas 11 are arranged at determined positions on each spiral turn. For example, if it is desired to have all spiral turns with substantially the same resistance, much more elongated P+-type areas will be positioned at the peripheral turns rather than in the central turns.

Figure 3:
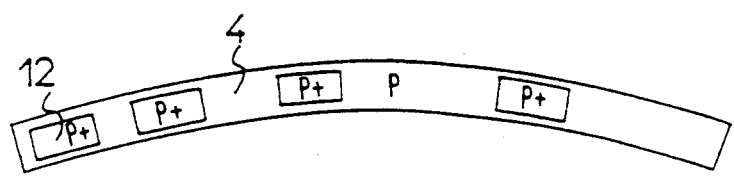
FIG. 3 is a partial top view of an embodiment of the invention.

In the embodiment of FIG. 1, the P+-type areas are arranged according to a determined length at each quarter of the spiral turn. In other embodiments, for example in the one illustrated in FIG. 3, it could be possible to provide for identical P+ regions 12, each of which has the same shape but with inequal densities along each turn of spiral 4.

With the invention, it is possible to have all the spiral turns with the same resistance value. Thus, the voltage applied between the terminals of the spiral could reach values up to several hundreds or over a thousand volts, since there would be the same voltage drop between each turn, whereas, in the absence of resistivity variations, the voltage drop between two adjacent points of the ultimate and penultimate turns would have been much higher than the voltage drop between two adjacent points of the first and second turns.

According to another advantage of the invention, even when breakdown voltage requirements do not make it compulsory to have a spiral, each turn of which has substantially the same resistance, the invention permits to obtain a selected resistance value for the whole spiral.

Considering a spiral having a predetermined number of turns, it will be formed by a diffusion of given conductivity type and doping level corresponding to the doping level used in another manufacturing step, for example for the well in which is formed one of the MOS transistors of a complementary MOS transistor couple. The overdoped regions will correspond to overdoped contact regions. Thus the formation of a spiral according to the invention does not need any additional manufacturing step as compared with conventional steps used in manufacturing the overall integrated circuit.

Of course, the invention is liable of numerous variants, its main feature being the modification of the resistance of each spiral turn by using enhanced conductivity areas obtained by means of a process corresponding to another manufacturing step. For example, aluminum shortings corresponding to the portions of an aluminum layer or other final mentallization step could be devised.

However, this implementation would render it difficult to obtain a determined resistance value, the electrical characteristics of the interface between a low doped region and an aluminum layer being not clearly defined. However, it would be possible to deposit on aluminum layer over the abovementioned overdoped regions 11 and 12.

We claim:

1. A resister comprising a spiral region of a second conductivity type having a determined doping level, formed on a first surface of a semiconductor substrate of a first conductivity type, a first terminal connected to a first extremity of the spiral on said first surface and a second terminal electrically connected to the second surface of the substrate through an overdoped region of the same conductivity type as the substrate, wherein regions of higher conductivity than the conductivity of regions of said determined doping level are formed at determined places of the spiral.

2. A resistor according to claim 1, wherein said regions of higher conductivity are of the second conductivity type having a doping level higher than said determined doping level.

3. A resistor according to claim 1, wherein the spiral region comprises a plurality of turns and the relative proportion of the regions of higher conductivity are chosen so that the resistance of each spiral turn is the same as the resistance of the other spiral turns.

4. A resistor according to claim 2, wherein said determined doping level and the doping level corresponding to said regions of higher conductivity correspond to doping levels resulting from processing steps carried out in an overall circuit formed in said semiconductor substrate.

5. A resistor according to claim 1, wherein said regions of higher conductivity comprise metal deposits formed on areas of the spiral.

* * * * *